US012787530B2

(12) United States Patent
Tavernier et al.

(10) Patent No.: US 12,787,530 B2
(45) Date of Patent: Nov. 3, 2026

(54) PROCESS FOR MANUFACTURING A LED DEVICE

(71) Applicant: Commissariat à l'Énergie Atomique et aux Énergies Alternatives, Paris (FR)

(72) Inventors: Aurelien Tavernier, Grenoble Cedex (FR); Nicolas Posseme, Grenoble Cedex (FR); Romain Sommer, Grenoble Cedex (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 441 days.

(21) Appl. No.: 18/037,283

(22) PCT Filed: Oct. 26, 2021

(86) PCT No.: PCT/EP2021/079708
§ 371 (c)(1),
(2) Date: May 16, 2023

(87) PCT Pub. No.: WO2022/106160
PCT Pub. Date: May 27, 2022

(65) Prior Publication Data

US 2024/0006459 A1 Jan. 4, 2024

(30) Foreign Application Priority Data

Nov. 19, 2020 (FR) ....................................... 2011913

(51) Int. Cl.
*H10H 29/14* (2025.01)

(52) U.S. Cl.
CPC ................................ *H10H 29/142* (2025.01)

(58) Field of Classification Search
CPC ............. H10H 29/142; H10H 20/0362; H10H 20/854; H10H 20/853; H10H 20/813
See application file for complete search history.

(56) References Cited

U.S. PATENT DOCUMENTS 8,865,489 B2 * 10/2014 Rogers ................ H01L 25/0753 438/459
2013/0092900 A1 * 4/2013 Lowgren .............. H10H 20/818 257/13

(Continued)

FOREIGN PATENT DOCUMENTS

FR 3076170 A1 * 6/2019 ........... H10H 20/841

OTHER PUBLICATIONS

International Search Report and Written Opinion for International Application No. PCT/EP2021/079708, mailed Feb. 1, 2022.

(Continued)

*Primary Examiner* — Fernando L Toledo
*Assistant Examiner* — Marshall Mu-Nuo Hatfield
(74) *Attorney, Agent, or Firm* — Wolf, Greenfield & Sacks, P.C.

(57) ABSTRACT

An optoelectronic device manufacturing method, including the steps of: forming, on the upper surface side of a first substrate, a plurality of LEDs, each formed of a three-dimensional semiconductor element; depositing, on the upper surface side of the first substrate, a first layer made of a first material different from silicon oxide, the first layer laterally surrounding and covering the LEDs and having a planar upper surface; and depositing a second layer made of silicon oxide on the upper surface of the first layer, wherein the first material is such that the first layer is selectively etchable over the LEDs and that the second layer is selectively etchable over the first layer.

8 Claims, 2 Drawing Sheets

(56) References Cited

U.S. PATENT DOCUMENTS

| | | | | |
|---|---|---|---|---|
| 2014/0370631 | A1 | 12/2014 | Thompson et al. | |
| 2015/0200338 | A1 * | 7/2015 | Kim | H10H 20/8513 257/98 |
| 2016/0056330 | A1 * | 2/2016 | Scaringella | H01L 24/05 438/27 |
| 2020/0403130 | A1 * | 12/2020 | Volpert | H10H 29/142 |
| 2021/0066540 | A1 * | 3/2021 | Bi | H10H 20/01 |

OTHER PUBLICATIONS

Fuard et al., Etch mechanisms of low dielectric constant polymers in high density plasmas: Impact of charging effects on profile distortion during the etching process. Journal of Vacuum Science & Technology B: Microelectronics and Nanometer Structures Processing, Measurement, and Phenomena. Nov. 2001;19(6):2223-30.

Fuard et al., High density plasma etching of low k dielectric polymers in oxygen-based chemistries. Journal of Vacuum Science & Technology B: Microelectronics and Nanometer Structures Processing, Measurement, and Phenomena. Mar. 2001;19(2):447-55.

* cited by examiner

PROCESS FOR MANUFACTURING A LED DEVICE

This application is a national stage filing under 35 U.S.C. § 371 of International Patent Application Serial No. PCT/EP2021/079708, filed Oct. 26, 2021, which claims priority to French patent application FR2011913 filed on Nov. 19, 2020 and entitled Process for Manufacturing a LED Device. The contents of these applications are incorporated herein by reference in their entirety.

TECHNICAL BACKGROUND

The present disclosure generally relates to optoelectronic devices, and more particularly aims at the forming of an emissive display device with light-emitting diodes (LED) comprising three-dimensional semiconductor elements, for example, of nanowire or microwire type.

PRIOR ART

It has already been provided, for example, in document WO2020/128341, to form an emissive screen with LEDs for which each pixel of the screen comprises a plurality of elementary LEDs, each formed of a three-dimensional semiconductor element, for example, of nanowire of microwire type, connected in parallel between two electrodes of an active control circuit of the screen.

Known methods for forming such a screen however have disadvantages that is would be desirable to totally or partly overcome.

SUMMARY OF THE INVENTION

An embodiment provides an optoelectronic device manufacturing method, comprising the following steps:

- forming, on the upper surface side of a first substrate, a plurality of LEDs, each formed of a three-dimensional semiconductor element;
- depositing, on the upper surface side of the first substrate, a first layer made of a first material different from silicon oxide, the first layer laterally surrounding and covering the LEDs and having a planar upper surface; and
- depositing a second silicon oxide layer on the upper surface of the first layer, wherein the first material is such that the first layer is selectively etchable over the LEDs and that the second layer is selectively etchable over the first layer.

According to an embodiment, the first layer is made of a carbon polymer material.

According to an embodiment, the method further comprises, before the deposition of the first layer, a step of conformal deposition of a protection layer covering the LEDs.

According to an embodiment, the first material is selectively etchable over the protection layer.

According to an embodiment, the protection layer is made of silicon nitride.

According to an embodiment, the method comprises a step of forming of a local cavity in the stack comprising the first and second layers.

According to an embodiment, the step of forming of the cavity comprises a first step of etching of the second layer by an etch method selective over the material of the first layer, followed by a second step of etching of the first layer by an etch method selective over the LEDs.

According to an embodiment, the first etching step is a plasma etching implemented by means of a fluorocarbon plasma.

According to an embodiment, the second etching is a plasma etching implemented by means of a plasma based on oxygen or on hydrogen.

According to an embodiment, the method further comprises, after the step of deposition of the second layer and before the step of forming of the cavity, a step of bonding of a temporary substrate onto the upper surface of the second layer, followed by a step of removal of the temporary substrate to free the access to the upper surface of the second layer.

According to an embodiment, the first layer is deposited by spin coating.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the forming of the three-dimensional LEDs of the described devices has not been detailed, the described embodiments being compatible with all or most known embodiments of three-dimensional LEDs. Further, the forming of the contact electrodes and of the circuits for controlling the LEDs has not been detailed, the described embodiments being compatible with known embodiments of the contact electrodes and of the control circuits of three-dimensional LEDs.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, when reference is made to absolute positional qualifiers, such as the terms “front”, “back”, “top”, “bottom”, “left”, “right”, etc., or to relative positional qualifiers, such as the terms “above”, “below”, “upper”, “lower”, etc., or to qualifiers of orientation, such as “horizontal”, “vertical”, etc., reference is made, unless specified otherwise, to the orientation of the figures.

Unless specified otherwise, the expressions “around”, “approximately”, “substantially” and “in the order of” signify within 10%, and preferably within 5%.

Figure 1A:
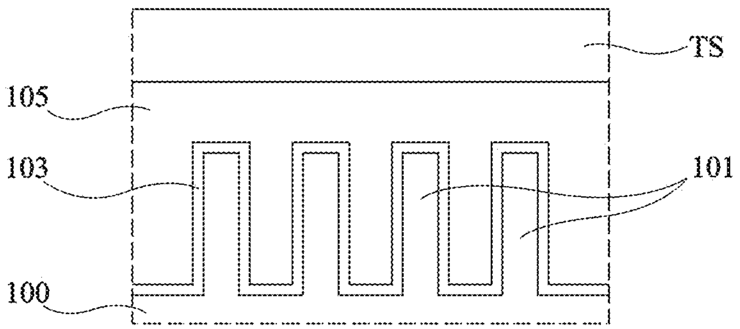
FIGS. 1A and 1B are cross-section views schematically showing successive steps of an example of a method of manufacturing a device with LEDs.
Figure 1B:
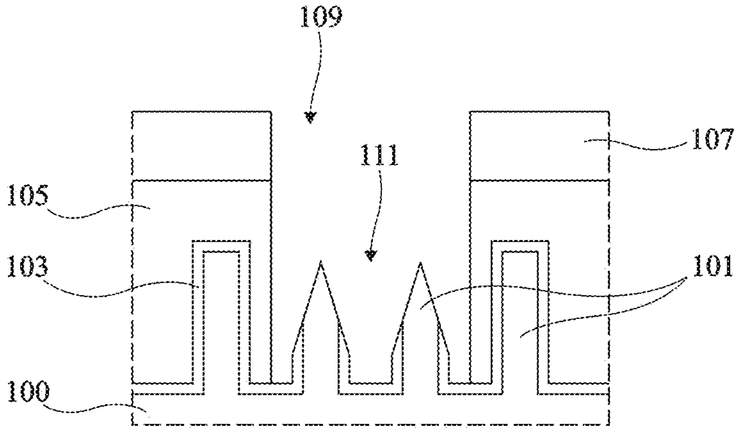

FIGS. 1A and 1B are cross-section views schematically showing successive steps of an example of a method of manufacturing a device with three-dimensional LEDs.

FIG. 1A illustrates an intermediate structure comprising a substrate 100 and, on the upper surface side of substrate 100, a plurality of elementary three-dimensional LEDs 101, for example, identical or similar (to within manufacturing dispersions), each formed of a three-dimensional semiconductor element, for example, a semiconductor nanowire or microwire. The term three-dimensional semiconductor element here designates an element elongated along a main direction called longitudinal direction. Such an element may have a wire shape, or also a conical or frustoconical shape, or a pyramidal shape. As an example, each three-dimensional semiconductor element has a maximum transverse dimension in the range from 5 nm to 2.5 μm, for example, from 50 nm to 1 μm, and a longitudinal dimension greater than or equal to 1 time, preferably greater than or equal to 5 times, its maximum transverse direction.

Each elementary LED 101 for example comprises one or a plurality of semiconductor materials selected from the group comprising III-V compounds, II-VI compounds, or group-IV semiconductors or compounds. Each LED 101 may be at least partly made of gallium nitride.

Each three-dimensional semiconductor element constitutive of a LED 101 may have a shape elongated along an axis substantially perpendicular to the upper surface of substrate 100, for example, a generally cylindrical shape. The distance between the longitudinal axes of two LEDs 101 is for example in the range from 100 nm to 3 μm, for example, from 200 nm to 1.5 μm. The height (longitudinal dimension) of LEDs 101 may be in the range from 250 μm to 15 μm, preferably in the range from 500 nm to 8 μm.

The different epitaxial growth steps implemented to form elementary three-dimensional LEDs 101 have not been detailed, the described embodiments being compatible with known methods of forming such elementary LEDs. In the drawings, the different semiconductor regions (anode region, cathode region, active region) forming each LED 101 have not been detailed.

The structure of FIG. 1A further comprises, on the upper surface side of substrate 100, a protection layer 103, for example made of a dielectric material transparent in the visible range, for example, made of silicon nitride, coating the lateral sides and the upper surface of each elementary LED 101, as well as the upper surface of substrate 100 between elementary LEDs 101. Layer 103 is for example formed by a method of conformal deposition, for example, by PVD ("Physical Vapor Deposition") or by ALD ("Atomic Layer Deposition"), after the growth of LEDs 101 on the upper surface of substrate 100. Layer 103 for example continuously extends with a substantially uniform thickness across the entire upper surface of the assembly comprising substrate 100 and elementary LEDs 101. Layer 103 is for example directly in contact with the upper surface and with the lateral sides of the three-dimensional semiconductor elements forming LEDs 101. The thickness of protection layer 103 is smaller than the spacing between elementary LEDs 101, so that layer 103 does not entirely fill the space between elementary LEDs 101. The thickness of layer 103 is for example in the range from 50 to 500 nm.

The structure of FIG. 1A further comprises, on the upper surface side of substrate 100, a silicon oxide layer 105 coating the upper surface of protection layer 103. Layer 105 extends across a thickness greater than the height of elementary three-dimensional LEDs 101. Thus, layer 105 entirely fills the spaces left free between LEDs 101 and covers LEDs 101. Layer 105 for example continuously extends over the entire surface of the device. Layer 105 has a substantially planar upper surface. As an example, the maximum thickness of layer 105 (between LEDs 101) is in the range from 5 to 10 μm. Layer 105 may be deposited by a low-temperature silicon oxide deposition, for example, a deposition method at a temperature lower than or equal to 400° C., which enables to avoid degrading the previously-formed three-dimensional LEDs 101. As an example, layer 105 is deposited by a method of PECVD-TEOS type, that is, a plasma-enhanced chemical vapor deposition method, using liquid TEOS (tetraethyl orthosilicate) as a source of silicon. After the deposition, a step of planarization of the upper surface of layer 105, for example, by chemical-mechanical polishing (CMP), may be implemented to obtain a planar upper surface.

Layer 105 may be used as a bonding interface to bond the assembly comprising support substrate 100 and elementary three-dimensional LEDs 101 on a temporary support substrate TS, for example, made of silicon.

As an example, the complete optoelectronic device manufacturing method may comprise the following successive steps (not detailed in the drawings):

a) forming of three-dimensional LEDs 101 on the upper surface of substrate 100;

b) deposition of protection layer 103 and then of bonding interface layer 105 on the upper surface side of substrate 100;

c) bonding of a temporary support substrate TS, for example, made of silicon, on the upper surface side of layer 105;

d) partial removal of substrate 100 and forming of contact electrodes (not shown in the drawings) on the lower surface side of elementary LEDs 101, using a temporary support substrate TS as a handle;

e) bonding and electric connection of an integrated circuit for controlling elementary LEDs 101, for example, a CMOS circuit, on the lower surface side of LEDs 101; and f) removal of the temporary support substrate TS from the upper surface side of the device.

At step c), the temporary support substrate TS may be bonded by direct bonding or molecular bonding of the lower surface of the temporary substrate to the upper surface of layer 105. The provision of a silicon oxide interface layer 105 is advantageous in that the bonding of a temporary silicon substrate by molecular bonding on a planar surface of a silicon oxide layer (step c)) and the subsequent removal of the temporary substrate (step f)) are methods well controlled in the field of microelectronics.

At this stage, the elementary three-dimensional LEDs 101 are for example all substantially identical, to within manufacturing dispersions, and all substantially emit at the same wavelength.

To obtain pixels adapted to emitting light at different wavelengths, it may be provided to coat the elementary LEDs 101 of at least certain pixels with a photoluminescent conversion element (not shown in the drawings). The conversion element is adapted to absorbing photons at the emission wavelength of the LEDs and of emitting back photons at another wavelength. For example, in the case where the LEDs are adapted to mainly emitting blue light, it may be provided, in first pixels, to coat the LEDs 101 of the pixel with a conversion element adapted to converting blue light into red light, in second pixels, to coat the LEDs 101 of the pixel with a conversion element adapted to converting blue light into green light, and, in third pixels, to leave the LEDs 101 non-coated with a conversion element. A red-green-blue color image display device is thus obtained.

The photoluminescent conversion elements are for example portions of an organic layer where quantum dots are embedded, or portions of a layer of a phosphorescent material.

In each pixel provided with a photoluminescent conversion element, to maximize the coupling between elementary LEDs 101 and the photoluminescent conversion element of the pixel, it may be provided to locally remove silicon oxide layer 105 in front of the pixel LEDs 101. The photoluminescent conversion element may then be deposited at closest to LEDs 101.

FIGS. 1A and 1B more particularly illustrate steps of a method of local removal of silicon oxide layer 105 in front of the elementary LEDs 101 of a pixel of the device, for the subsequent deposition of a photoluminescent conversion element.

FIG. 1A illustrates the structure obtained before removing the temporary substrate TS. FIG. 1B illustrates a step of forming of an etch mask 107 on the upper surface of silicon oxide layer 105, after removing the temporary substrate TS. Mask 107 is for example made of resin, and exhibits an opening 109 in front of the portion of layer 105 which is desired to be removed. Mask 107 is for example formed by photolithography.

FIG. 1B illustrates the structure obtained at the end of a step of removal of silicon oxide layer 105 in front of the opening 109 of mask 107. During this step, layer 105 is removed across its entire thickness in front of opening 109. There is thus formed in layer 105 a cavity 111 located in front of the elementary LEDs 101 of the pixel. Cavity 111 is intended to subsequently receive a photoluminescent conversion element of the pixel. In this example, layer 105 remains intact at the periphery of the pixel.

Layer 105 is for example removed by a plasma etching method, for example, by means of a fluorocarbon-type plasma, for example, a plasma based on octafluorocyclobutane ($C_4F_8$), on carbon monoxide (CO), and on argon (Ar).

The method of etching of layer 105 is selected to be relatively selective over the material of protection layer 103. However, due to the significant thickness of the silicon oxide layer 105 to be etched and due to the high form factors of elementary LEDs 101, the obtained selectivity is in practice insufficient. Thus, as illustrated in FIG. 1B, a significant flatting of three-dimensional LEDs 101 can be observed during the etching. In other words, the LEDs 101 located in cavity 111 are degraded, and may possibly be destroyed during the etching.

Figure 2A:
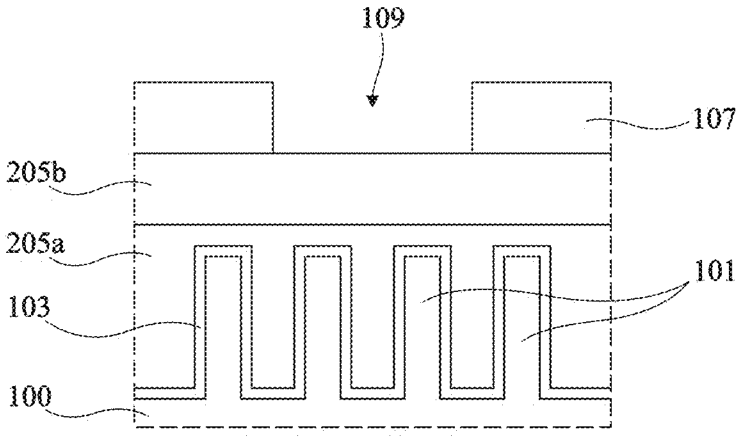
FIGS. 2A, 2B, and 2C are cross-section view schematically showing successive steps of an example of a method of manufacturing a device with LEDs according to an embodiment.
Figure 2B:
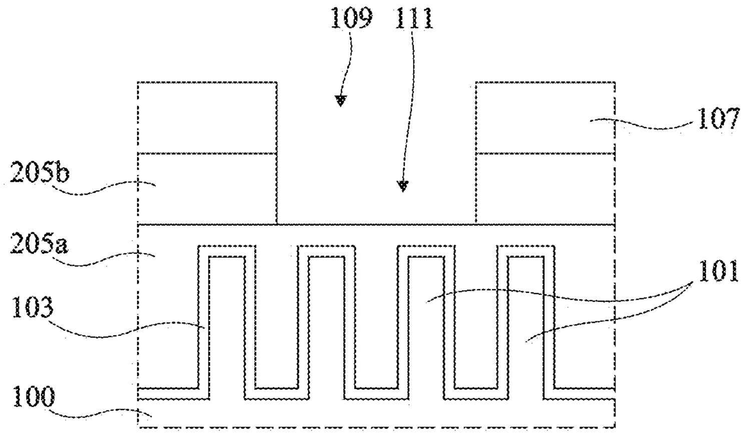
Figure 2C:
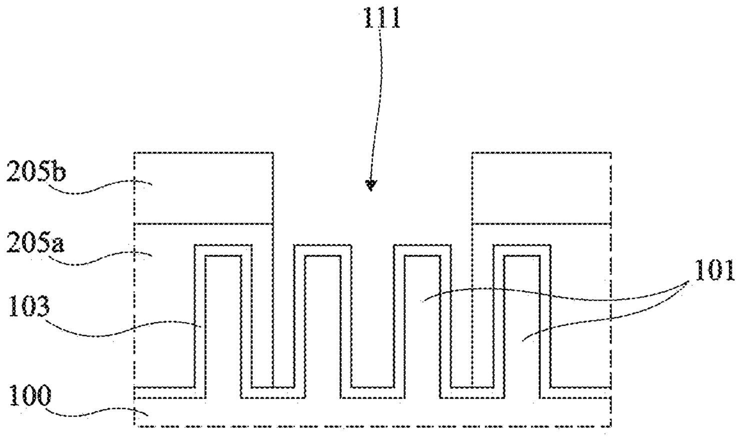

FIGS. 2A, 2B, and 2C are cross-section views schematically showing successive steps of an example of a method of manufacturing a device with three-dimensional LEDs according to an embodiment, aiming at overcoming the above-mentioned disadvantage of the method of FIGS. 1A and 1B.

FIG. 2A illustrates an intermediate structure similar to the structure of FIG. 1A. The structure of FIG. 2A differs from that of FIG. 1A mainly in that, in the structure of FIG. 2A, silicon oxide layer 105 is replaced with a bilayer comprising a lower layer 205*a* made of a first material different from silicon oxide, and an upper layer 205*b* made of silicon oxide.

Layer 205*a* extends across thickness greater than the height of three-dimensional elementary LEDs 101. Thus, layer 205*a* entirely fills the spaces left free between LEDs 101 and covers LEDs 101. Layer 205*a* for example continuously extends over the entire surface of the device. Layer 205*a* preferably has a substantially planar upper surface. As an example, the maximum thickness of layer 205*a* (between LEDs 101) is in the range from 5 to 10 μm. Layer 205*a* is for example in contact, by its lower surface, with the upper surface of protection layer 103. Layer 205*a* is preferably deposited by a low-temperature deposition method, for example at a temperature lower than or equal to 400° C. Layer 205*a* may be deposited by a spin coating method, having the advantage of planarizing the upper surface of layer 205*a*.

Layer 205*b* continuously extends across a substantially uniform thickness, over the entire surface of the device. Layer 205*b* is for example in contact, by its lower surface, with the upper surface of layer 205*a*. Layer 205*b* has a substantially planar upper surface. Layer 205*b* may be deposited by a low-temperature silicon oxide deposition method, for example, a deposition method at a temperature smaller than or equal to 400° C. As an example, layer 205*b* is deposited by a method of PECVD-TEOS type. After the deposition, a step of planarization of the upper surface of layer 205*b*, for example, by chemical-mechanical polishing (CMP), may be implemented to improve its surface evenness. The thickness of layer 205*b* is for example in the range from 0.5 to 5 μm, for example from 1 to 2 μm.

Layer 205*b* may be used as a bonding interface to bond the assembly comprising support substrate 100 and elementary three-dimensional LEDs 101 on a temporary support substrate, for example, made of silicon, such as previously described.

After the removal of temporary support substrate, similarly to what has been previously described, cavities may be formed in the stack of layers 205*a* and 205*b* in front of certain pixels of the sensor, these cavities being intended to receive photoluminescent color conversion elements.

FIGS. 2A, 2B, and 2C more particularly illustrate steps of a method of local removal of the stack of layers 205*a* and 205*b* in front of the elementary LEDs 101 of a pixel of the device, for the subsequent deposition of a photoluminescent conversion element.

According to an aspect of an embodiment, layer 205*a* is made of a material such that the first layer is selectively etchable over LEDs 101 and such that silicon oxide layer 205*b* is selectively etchable over layer 205*a*. In this example, the material of layer 205*a* is selected to be selectively etchable over the material of protection layer 103. As a variant, protection layer 103 may be omitted, in which case the material of layer 205*a* is selected to be selectively etchable over the semiconductor materials of LEDs 101.

Layer 205*a* is preferably made of a dielectric material. Layer 205*a* is for example made of a polymer material, preferably a carbon polymer or organic polymer. The material of layer 205*a* is preferably resistant to relatively high temperatures, for example in the range from 400° C. to 600° C. This enables to resist subsequent thermal treatment steps, particularly during the deposition of the photoluminescent conversion elements.

In a preferred embodiment, the material of layer 205*a* is a hydrocarbon polymer, for example of the type known under trade name SiLK. As a variant, the material of layer 205*a* may be a polymer of the type currently designated with acronym SoC, for "spin-on carbon", that is, a polymer material with a high carbon content, for example, a carbon concentration greater than 80% capable of being deposited by spin coating. As a variant, the material of layer 205*a* may be a polyimide.

FIG. 2A illustrates the structure obtained at the end of a step of forming of an etch mask 107 on the upper surface of silicon oxide layer 205*b*. Mask 107 is for example made of resin, and exhibits an opening 109 in front of the portion of the stack of layers 205*a* and 205*b* which is desired to be removed. Mask 107 is for example formed by photolithography.

FIG. 2B illustrates the structure obtained at the end of a step of removal of silicon oxide layer 205*b* in front of the opening 109 of mask 107. During this step, layer 205*b* is removed across its entire thickness in front of opening 109. There is thus formed in layer 205*b* a cavity 111 located in front of the elementary LEDs 101 of the pixel. At this step, the etching is interrupted on the upper surface of layer 205*a*. For this purpose, layer 205*b* is removed by an etching method adapted to etching the silicon oxide selectively over the material of layer 205*a*.

Layer 205*b* is for example removed by a plasma etching method, for example, by means of a fluorocarbon-type plasma, for example, a plasma based on octafluorocyclobutane ($C_4F_8$), on carbon monoxide (CO), and on argon (Ar).

FIG. 2C illustrates the structure obtained at the end of a step of removal of layer 205*a* in front of the opening 109 of mask 107. During this step, layer 205*a* is removed across its entire thickness in front of opening 109. Cavity 111 is thus extended in front of the elementary LEDs 101 of the pixel. At this step, the etching is interrupted on the upper surface of the protection layer 103 of elementary LEDs 101. For this purpose, layer 205*a* is removed by an etch method adapted to etching the material of layer 205*a* selectively over the material of protection layer 103. As a variant, protection layer 103 may be omitted, in which case the etching is directly interrupted on the semiconductor material of elementary LEDs 101. In this case, layer 205*a* is removed by an etch method adapted to etching the material of layer 205*a* selectively over the semiconductor materials of LEDs 101.

Layer 205*a* is for example removed by a plasma etching method, for example, by means of a plasma based on oxygen, for example, a plasma based on oxygen ($O_2$) and argon (Ar), or a plasma based on oxygen ($O_2$), on nitrogen ($N_2$), and on carbon tetrafluoride ($CF_4$), or a plasma based on sulfur dioxide ($SO_2$) and on oxygen ($O_2$), or a plasma based on carbon oxysulfide (COS) and on oxygen ($O_2$). As a variant, layer 205*a* is removed by means of a plasma based on hydrogen ($H_2$) or a plasma based on hydrogen ($H_2$) and on nitrogen ($N_2$). These examples of chemistry have the advantage of etching the carbon polymer materials very selectively over the silicon nitride of protection layer 103, or over the semiconductor materials of LEDs 101 in the absence of protection layer 103.

An advantage of the method described in relation with FIGS. 2A, 2B, and 2C is that it enables to do away with the problem of flatting of the elementary LEDs 101 of the method of FIGS. 1A and 1B. This may in particular enable to decrease the thickness of protection layer 103, or even to entirely remove protection layer 103. As an example, layer 103 has a thickness in the range from 0.1 to 1 μm.

Various embodiments and variants have been described. Those skilled in the art will understand that certain features of these various embodiments and variants may be combined, and other variants will occur to those skilled in the art. In particular, the described embodiments are not limited to the examples of materials and of dimensions nor to the examples of etch chemistry mentioned in the disclosure.

The invention claimed is:

1. An optoelectronic device manufacturing method, comprising the following steps:

forming, on the upper surface side of a first substrate, a plurality of LEDs, each formed of a three-dimensional semiconductor element;

depositing, on the upper surface side of the first substrate, a first layer made of a first material different from silicon oxide, said first layer laterally surrounding and covering the LEDs and having a planar upper surface; and depositing a second layer made of silicon oxide on the upper surface of the first layer, wherein the first material is such that the first layer is selectively etchable over the LEDs and that the second layer is selectively etchable over the first layer, the method further comprising a step of forming, in the stack comprising the first and second layers, of a cavity located in front of the LEDs of a pixel of the device;

wherein said step of forming of the cavity comprises a first step of etching of the second layer by a method of selective etching over the material of the first layer, followed by a second step of etching of the first layer by a method of selective etching over the LEDs;

the method further comprising, after the step of deposition of the second layer and before the step of forming of the cavity, a step of bonding of a temporary substrate onto the upper surface of the second layer by direct bonding or molecular bonding of the lower surface of the temporary substrate to the upper surface of the second layer, followed by a step of removal of the temporary substrate to free the access to the upper surface of the second layer.

2. The method according to claim 1, wherein the first layer is made of a carbon polymer material.

3. The method according to claim 1, further comprising, before the deposition of the first layer, a step of conformal deposition of a protection layer coating the LEDs.

4. The method according to claim 3, wherein the first material is selectively etchable over the protection layer.

5. The method according to claim 3, wherein the protection layer is made of silicon nitride.

6. The method according to claim 1, wherein the first etch step is a plasma etching implemented by means of a fluorocarbon plasma.

7. The method according to claim 1, wherein the second etching is a plasma etching implemented by means of a plasma based on oxygen or on hydrogen.

8. The method according to claim 1, wherein the first layer is deposited by spin coating.

* * * * *